United States Patent
Ganesan (10) Patent No.: US 6,938,469 B2
(45) Date of Patent: Sep. 6, 2005

(54) METHOD FOR DETERMINING PROPERTIES OF FORMATION FLUIDS

(75) Inventor: Krishnamurthy Ganesan, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 222 days.

(21) Appl. No.: 10/604,640

(22) Filed: Aug. 6, 2003

(65) Prior Publication Data

US 2005/0030034 A1 Feb. 10, 2005

(51) Int. Cl.$^7$ .............................. E21B 47/10; G01V 3/00
(52) U.S. Cl. ............................. 73/152.18; 73/152.55; 324/303
(58) Field of Search ..................... 73/152.55, 152.18, 73/861.16, 861.17; 324/303

(56) References Cited

U.S. PATENT DOCUMENTS

| | | | |
|---|---|---|---|
| 3,329,020 A | * 7/1967 | Cushing | 73/861.14 |
| 3,934,468 A | 1/1976 | Brieger | |
| 4,235,095 A | * 11/1980 | Liebermann | 73/19.03 |
| 4,291,271 A | * 9/1981 | Lauffer | 324/307 |
| 4,656,422 A | * 4/1987 | Vail et al. | 324/303 |
| 4,860,581 A | 8/1989 | Zimmerman et al. | |
| 5,341,100 A | * 8/1994 | Taylor | 324/341 |
| 5,514,283 A | * 5/1996 | Stefanini | 210/695 |
| 5,831,433 A | 11/1998 | Sezginer et al. | |
| 6,069,479 A | * 5/2000 | Taicher et al. | 324/309 |
| 6,111,408 A | * 8/2000 | Blades et al. | 324/303 |
| 6,121,773 A | * 9/2000 | Taicher et al. | 324/303 |
| 6,346,813 B1 | 2/2002 | Kleinberg | |
| 6,624,629 B1 | * 9/2003 | Speier et al. | 324/303 |
| 6,792,798 B2 | * 9/2004 | Liang | 73/152.58 |
| 6,825,657 B2 | * 11/2004 | Kleinberg et al. | 324/303 |

OTHER PUBLICATIONS

Caprihan et al., "Flow Measurements by NMR", May 1990, Physics Reports, 198, No. 4, pp. 195–235.*
DI Hoult and PC Lauterbur, "The Sensitivity of the Zeugmatographic Experiment Involving Human Samples," *J. Mag. Res.* 34, pp. 425–433 (1979).
DG Gadian and FNH Robinson, "Radiofrequency Losses in NMR Experiments on Electrically Conducting Samples,"*J. Mag. Res.* 34, pp. 449–455 (1979).
A Macovski, "Noise in MRI," *Mag. Res. Med.* 36, 494–497 (1996).

* cited by examiner

*Primary Examiner*—Hezron Williams
*Assistant Examiner*—John Fitzgerald
(74) *Attorney, Agent, or Firm*—Martin Novack; Kevin McEnaney; Victor H. Segura (57) ABSTRACT

A method is disclosed for downhole determination of the resistivity of fluids from formations surrounding an earth borehole, including the following steps: providing a formation testing logging device that includes a coil and a flow line passing axially through the coil; determining a reference quality factor of the coil; positioning the formation testing device in the borehole, and causing formation fluid to flow through the flow line; measuring the quality factor of the coil with formation fluid in the flow line; and determining the resistivity of the formation fluid in the flow line as a function of the measured quality factor and the reference quality factor.

29 Claims, 12 Drawing Sheets

METHOD FOR DETERMINING PROPERTIES OF FORMATION FLUIDS

BACKGROUND OF INVENTION

1. Field of the Invention

This invention relates to techniques for determining properties of formations surrounding an earth borehole and, more particularly, to a technique for downhole determination of the resistivity of fluids extracted from earth formations.

2. Background of the Invention

The resistivity of fluids in earth formations is known to be a very important indicator of the nature of the formations. The well logging art contains numerous approaches to indirect and direct determination of formation fluid resistivity. [In the present application, any references to determination or use of resistivity are intended to generically mean conductivity as well, and vice versa. These quantities are reciprocals, and mention of one or the other herein is for convenience of description, and not intended in a limiting sense]. Several techniques are commonly used to measure the resistivity of the formations (the fluid and the matrix containing the fluid) using measurements from a logging device in the borehole, which, for example, can employ electrodes to perform so-called "normal" or "lateral" resistivity logging, or coils to perform induction logging. Electrodes can also be used for spontaneous potential ("SP") logging to determine formation water resistivity. It has also been proposed that formation resistivity can be determined by measuring the impedance looking into an antenna coil in a borehole, the antenna also serving a source of RF energy for a companion NMR technique (see U.S. Pat. No. 5,831,433).

The resistivity of formation fluid samples drawn from the formations by a logging device, such as a so-called formation testing tool, can be measured directly downhole, and this is typically performed using electrodes spaced apart in the fluid. However, a problem with contact measurements of fluid resistivities is that the electrodes can be wetted by one of the fluids. This may bias the measurements. Another problem is that when measurements are made in vertical or highly deviated wells, the effects of gravity segregation of the fluids typically results in measurement errors unless the fluids are flowing.

It is among the objects of the present invention to provide a method for downhole determination of formation fluid resistivity which is efficient to practice and which overcomes shortcomings of prior art approaches.

SUMMARY OF INVENTION

The present invention is directed to a method for downhole determination of the resistivity of fluids from formations surrounding an earth borehole. An embodiment of the method of the invention includes the following steps: providing a formation testing logging device that includes a coil and a flow line passing axially through the coil; determining a reference quality factor of the coil; positioning the formation testing device in the borehole, and causing formation fluid to flow through the flow line; measuring the quality factor of the coil with formation fluid in the flow line; and determining the resistivity of the formation fluid in the flow line as a function of the measured quality factor and the reference quality factor. The step of measuring the quality factor can be performed as formation fluid flows axially through the coil, or with formation fluid axially within the coil and non-flowing. An embodiment of the invention further includes providing a Faraday shield between the coil and the flow line, the shield being operative to prevent electrical lines of force associated with distributed capacitance from passing through the formation fluid within the coil during said step of measuring the quality factor of the coil.

In a further embodiment of the invention, both the dielectric constant and the resistivity of formation fluid in the flow line are determined.

The invention has advantageous application to so-called formation testing well logging devices that draw fluids from earth formations, but can also be employed in other settings, examples being measurement while drilling or measurement while tripping.

Further features and advantages of the invention will become more readily apparent from the following detailed description when taken in conjunction with the accompanying drawings.

BRIEF DESCRIPTION OF DRAWINGS

FIGS. 9 and 10 are graphs showing calculated and experimental series resistance as a function of sample conductivity at 9.88 MHz. In FIG. 10, lower conductivities are shown in further detail.

FIGS. 11 and 12 are graphs showing calculated and experimental series resistance as a function of sample conductivity at 19.655 MHz. FIG. 12 shows lower conductivities in further detail.

DETAILED DESCRIPTION

Figure 1:
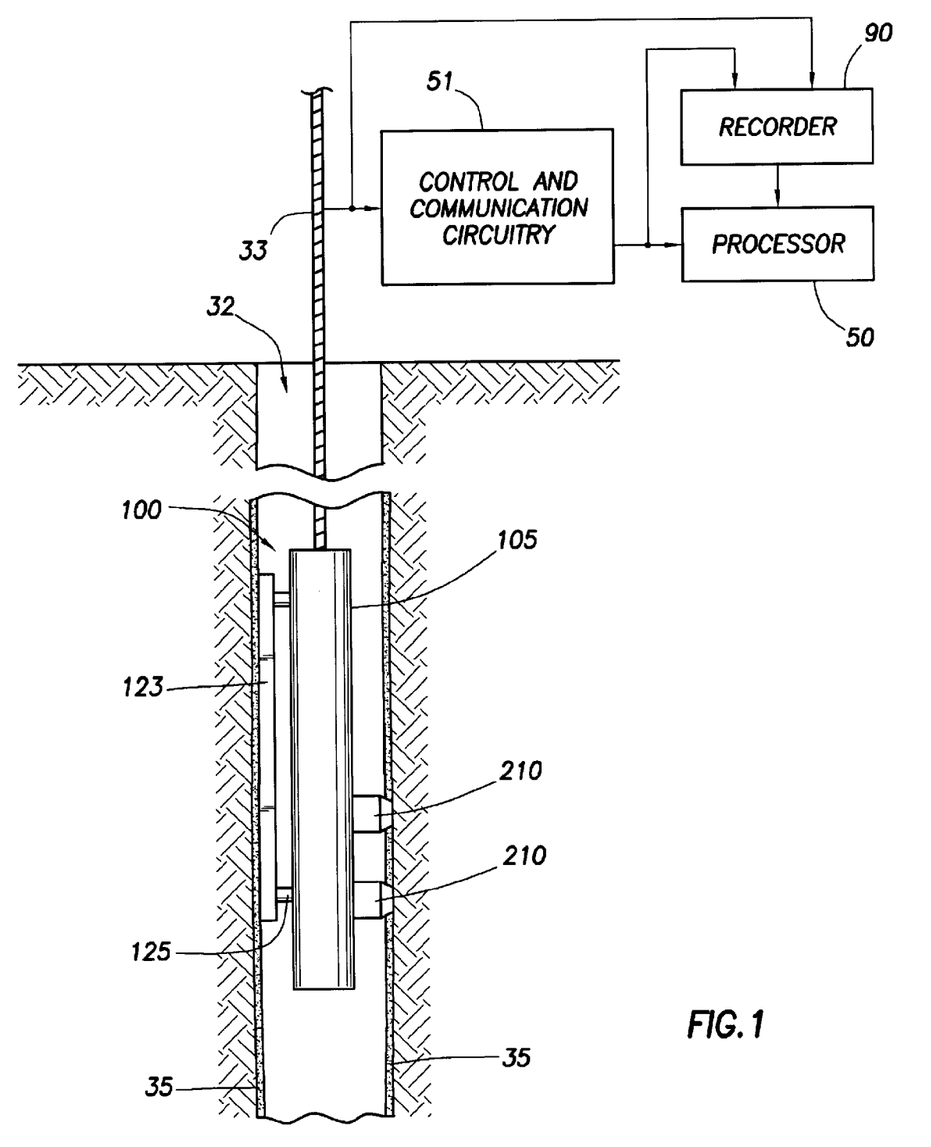
FIG. 1 is a diagram, partially in block form, of a formation testing logging device of a type that can be used in practicing embodiments of the invention.

FIG. 1 shows the borehole 32 that has been drilled, in known manner, with drilling equipment, and using drilling fluid or mud that has resulted in a mudcake represented at 35. A formation tester apparatus or device 100 is shown, and can be used in practicing embodiments of the invention. The apparatus 100 is suspended in the borehole 32 on an armored multiconductor cable 33, the length of which substantially determines the depth of the device 100. Known depth gauge apparatus (not shown) is provided to measure cable displacement over a sheave wheel (not shown) and thus the depth of logging device 100 in the borehole 32. Circuitry 51, shown at the surface although portions thereof may typically be downhole, represents control and communication circuitry for the investigating apparatus. Also shown at the surface are processor 50 and recorder 90.

The tool 100 has an elongated body 105 which encloses the downhole portion of the apparatus, controls, chambers, measurement means, etc. One or more arms 123 can be mounted on pistons 125 which extend, e.g. under control from the surface, to set the tool. The device includes one or more probe modules, each of which includes a probe assembly 210 which is movable with a probe actuator (not separately shown) and includes a probe (not separately shown) that is outwardly displaced into contact with the borehole wall, piercing the mudcake and communicating with the formations. The equipment and methods for taking pressure measurements and doing formation fluid sampling are well known in the art, and the logging device 100 is provided with these known capabilities. Reference can be made, for example, to U.S. Pat. Nos. 3,934,468 and 4,860,581, which describe early versions of devices of this general type.

Modern commercially available services utilizing, for example, a modular formation dynamics tester ("MDT"-trademark of Schlumberger), can provide a variety of measurements and samples, as the tool is modularized and can be configured in a number of ways. Examples of some of the modules employed in this type of tool, are as follows: An electric power module is generally provided. It does not have a flowline or hydraulic bus, and will typically be the first (top) module in the string. A hydraulic power module provides hydraulic power to all modules that may require same, and such power can be propagated via a hydraulic bus. Probe modules, which can be single or plural probes, includes pistons for causing engagement of probe(s) for fluid communication with the formations. Sample modules contain sample chambers for collecting samples of formation fluids, and can be directly connected with sampling points or connected via a flowline. A pumpout module can be used for purging unwanted fluids. An analyzer module uses optical analysis to identify certain characteristics of fluids. A temperature measurement capability is also provided. A packer module includes inflatable packer elements which can seal the borehole circumference over the length of the packer elements. Using the foregoing and other types of modules, the tool can be configured to perform various types of functions. An embodiment of the present invention has application to tool configurations which draw formation fluid into the tool and, typically, although not necessarily, return the fluid into the borehole. As first noted above, the resistivity of the formation fluid in the flow line can be measured using spaced apart electrodes in the fluid. The present invention utilizes a different technique, which overcomes limitations of prior art approaches.

Figure 2:
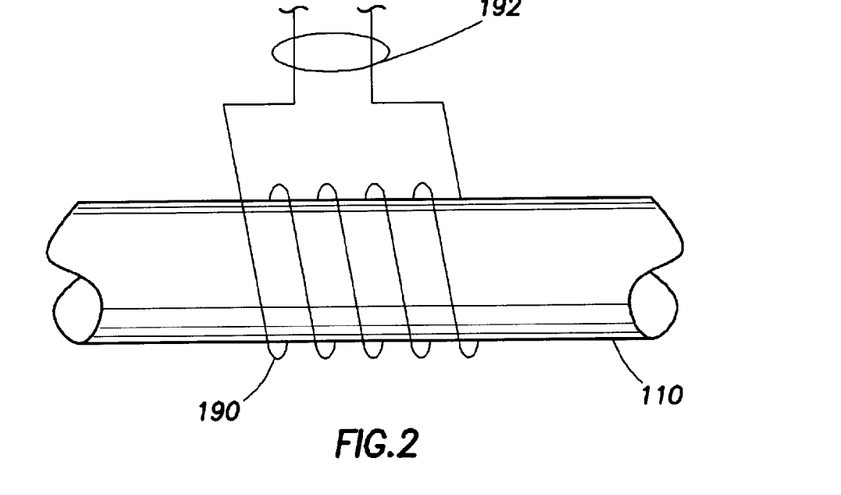
FIG. 2 is a diagram of an electrical coil, and an electrically non-conductive flow line passing axially through the coil.

It is known in the art that formation fluid in the flowline of the formation testing logging tool can be subjected to nuclear magnetic resonance (NMR) measurements by providing a coil (e.g. coil 210 in FIG. 2) through which formation fluid can pass axially in an electrically non-conductive portion of the flowline (e.g. 110 of FIG. 2), the coil being used to produce and receive rf energy in the presence of a static magnetic field produced by permanent magnets (not shown). (Reference can be made, for example, to U.S. Pat. No. 6,346,813.) In an embodiment of the present invention, the same coil (210) can be utilized in a technique for downhole determination of formation fluids. It will be understood, however, that, if desired, a different coil on the flowline can be used in this embodiment. Signals under control of the processor(s) are coupled with the coil via leads 192.

Some of the theory relating to operation of the invention will next be set forth.

A tuned antenna includes an inductor (L), capacitor (C), and a resistor (R) in series or in parallel combination. The quality factor of the tuned circuit (Q) is given as $$Q = \text{Energy Stored/Energy Loss} = \omega L/R, \quad (1)$$

where $\omega$ is the operating frequency, L is the inductance of the coil, and R is the series resistance of the circuit.

In air, the losses in the antenna mainly come from all the components (e.g., inductor, capacitor) in the tuned circuit.

The resistive losses of the antenna in air are determined by parameters such as copper losses, capacitor losses, ferrite losses (if a ferrite is used). The internal loss is denoted as Rint and the quality factor of the tuned circuit is $$Q = \omega L/Rint \quad (2)$$

In addition to internal losses, there can also be losses due to the sample under test. The sample losses could be due to inductive and/or dielectric losses (see "The Sensitivity of the Zeugmatographic Experiment Involving Human Samples," D I Hoult, P C Lauterbur, J M R, 34, 425–433, (1979); "Radiofrequency Losses in NMR Experiments on Electrically Conducting Samples," D G Gadian, F N H Robinson, J M R, 34(2) 449–455, (1979); "Noise in MRI," A Macovski, Mag. Reson. Med. 36, 494–497, (1996)).

Inductive losses are associated with the conductivity of the sample. The radiation of RF EM fields from the coil, induce eddy current in a conducting sample, which dissipate power. The power dissipation can be expressed as an effective resistance $R_L$ in series with the inductor. This loss cannot be avoided, but it can be estimated from the physical dimensions of the coil and the sample.

Figure 3:
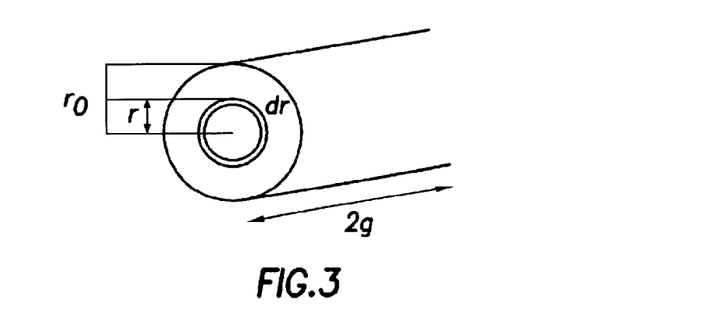
FIG. 3 is a diagram useful in illustrating calculation of inductive losses in a conductive sample.

The loss caused by the induced voltage is determined by first calculating the average power dissipated from an applied voltage. The dissipated power is used to calculate the effective series resistance $R_L$. The calculation of this loss is as follows: The resultant loss caused by the induced voltage is determined by first calculating the power dissipated from an applied voltage and using that power to calculate the effective series resistance $R_L$. For simplicity, assume a cylindrical solenoidal coil surrounding the fluid sample as shown in FIG. 3. The principle of reciprocity is used to calculate the effective series resistance. The coil is excited with unity peak amplitude current ($I_0 = 1$), $I = I_0 \cos$ ωt. The resultant average power dissipated by the conducting sample is given as $$Pav = W = I_0^2 R_L/2 = R_L/2, \quad (3)$$

where, $I_0$ is the peak sinusoidal current (unity in this case).

The magnetic field in the solenoid, which is assumed to be uniform, is given by $$B1 = n\mu_0 I/(2*sqrt(a^2+g^2)) \quad (4)$$

where n is the number of turns, $\mu_0$ is the permeability of vacuum, a is the radius of the coil, and 2 g is the length of the solenoid.

The voltage, Vp, induced in the cylindrical shell at a distance r is given by $$Vp = -d\phi/dt = -A\, dB1/dt = \pi r^2 \omega(n\mu_0/(2*sqrt(a^2+g^2)))\sin \omega t \quad (5)$$

where $A = \pi r^2$ is the area subtended by the cylindrical shell. The peak induced voltage, Vp, is used to calculate the average power dissipated in the shell as given by $$dW = (Vp^2/2)dG \quad (6)$$

where, the differential conductance of the cylindrical shell, dG, is given $$dG = 2g\, dr/(2\pi r\rho) \quad (7)$$

Integrate dW over the entire cylinder to find the total dissipated power $$W = \int dW = \int_0^{r_0} (\pi r^2 \omega(n\mu_0/(2*sqrt(a^2+g^2))))^2 (2g\, dr/4\pi r\rho) \quad (8)$$

The effective resistance, $R_L$, is then given by $$R_L = 2W = \pi \omega^2 n^2 \mu_0^2 g r_0^4/(16*\rho*(a^2+g^2)) \quad (9)$$

The series resistance can be calculated at various frequencies (ω) for given solenoid parameters (n, g, and a) as a function of resistivity (ρ).

Figure 5:
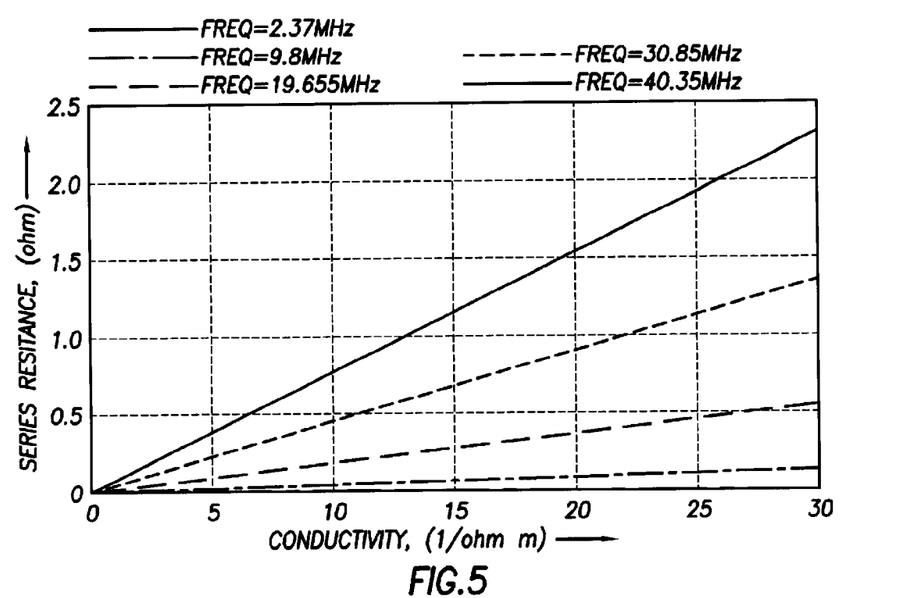
FIG. 5 is a graph of series resistance due to inductive loss as a function of sample conductivity for a solenoid used in an experiment.

As just set forth in (9), the effective resistance of the sample in series with the inductor is given as $$R_L = 2W = \pi \omega^2 n^2 \mu_0^2 g r_0^4/(16*\rho*(a^2+g^2))$$

where ω (=2πf) is the angular frequency, n is the number of coil turns, g is half the coil length, $r_0$ is the radius of the test tube containing the sample (the flow line, in this case), a is the radius of the coil, ρ is the resistivity of the sample, $\mu_0$ magnetic permeability of the vacuum, and W is the average dissipated power. Also, as stated, the series resistance can be calculated at various frequencies (ω) for a given solenoid parameters (n, g, and a) as a function of resistivity (ρ). FIG. 5 is a graph of series resistance due to inductive loss as a function of sample fluid conductivity for an experimental solenoid. The series resistance increases as the square of the frequency and correspondingly Q of the antenna will decrease at higher frequency in the presence of a conductive environment.

Figure 16:
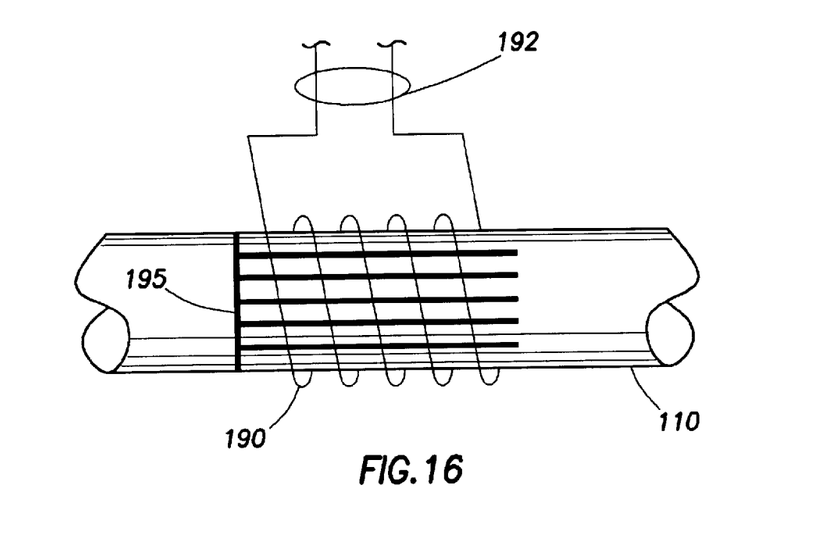
FIG. 16 illustrates an embodiment utilizing a Faraday shield.

In addition to the above mentioned sample losses, there can also be dielectric losses. This loss mechanism arises from the distributed capacitance of the coil. The electric field associated with the distributed capacitance of the coil passes through the sample, which dissipate power. This loss can be reduced or eliminated if a Faraday shield is inserted between the coil and the sample (see "Radiofrequency Losses in NMR Experiments on Electrically Conducting Samples," D G Gadian, F N H Robinson, J M R, 34(2) 449–455, (1979)). In an embodiment of the invention, as illustrated in FIG. 16, a Faraday shield 195 is disposed between the coil 190 and the flow line 110.

Figure 4:
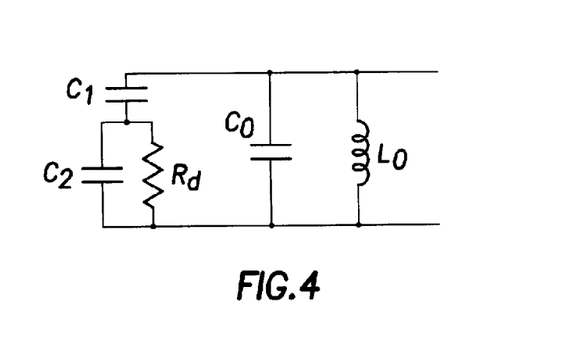
FIG. 4 is a schematic diagram for an equivalent circuit of a tuned circuit with dielectric loss.

The dielectric loss is calculated as follows: As treated above, this loss mechanism comes about from the distributed capacitance of the turns in the inductor coil (see "The Sensitivity of the Zeugmatographic Experiment Involving Human Samples," D I Hoult, P C Lauterbur, J M R, 34, 425–433, (1979)). The equivalent circuit is shown in FIG. 4, where $L_0$ and $C_0$ are the inductor and capacitor of the tuned circuit, $C_1$ is the (lossless) capacitance from coil to sample, C2 and Rd represent the lossy sample.

The complex admittance of the circuit containing C1, C2 and Rd is given by $$Y = Yreal + iYimag. \quad (10)$$

$$Yreal = (\omega^2 Rd C_1 2)/(1+\omega^2 Rd^2(C1+C2)^2) \quad (11)$$

$$Yimag = (\omega C_1 - \omega^3\, Rd^2 C_1 C_2 (C_1+C_2))/(1+\omega^2 Rd^2(C1+C2)^2) \quad (12)$$

The Yreal is zero, when Rd=0 and also when Rd=∞ and in between Yreal goes through a maximum at $$Rd = 1/(\omega(C_1+C_2)). \quad (13)$$

It also means that the parallel impedance across L and C goes through a minimum and the quality factor (Q) due to dielectric loss also goes through a minimum at that point. The parallel impedance is inversely related to the series impedance.

The time constant (Rd*$C_2$) of the dielectric relaxation time is determined from the dielectric relaxation theory (see "Radiofrequency Losses in NMR Experiments on Electrically Conducting Samples," D G Gadian, F N H Robinson, J M R, 34(2) 449–455, (1979)); and it is found to be $$Rd\, C_2 = \kappa \epsilon_0/\sigma, \quad (14)$$

where σ is the conductivity of the sample, κ is the relative dielectric constant of the sample and $\epsilon_0$ is the permittivity of free space (=8.85×10$^{-12}$F/m).

The series resistance is given by $$R_D = (\omega^4 L^2 Rd\, C_1^2)/(1+\omega^2 Rd^2(C1+C2)^2) \quad (15)$$

The dielectric loss ($R_D$) can be calculated as a function of the conductivity of the sample (σ) using equations (14) and (15). The capacitor values of $C_1$ and $C_2$ were found to be 0.8 pF and 2 pF respectively for a coil used in an experiment.

Figure 6:
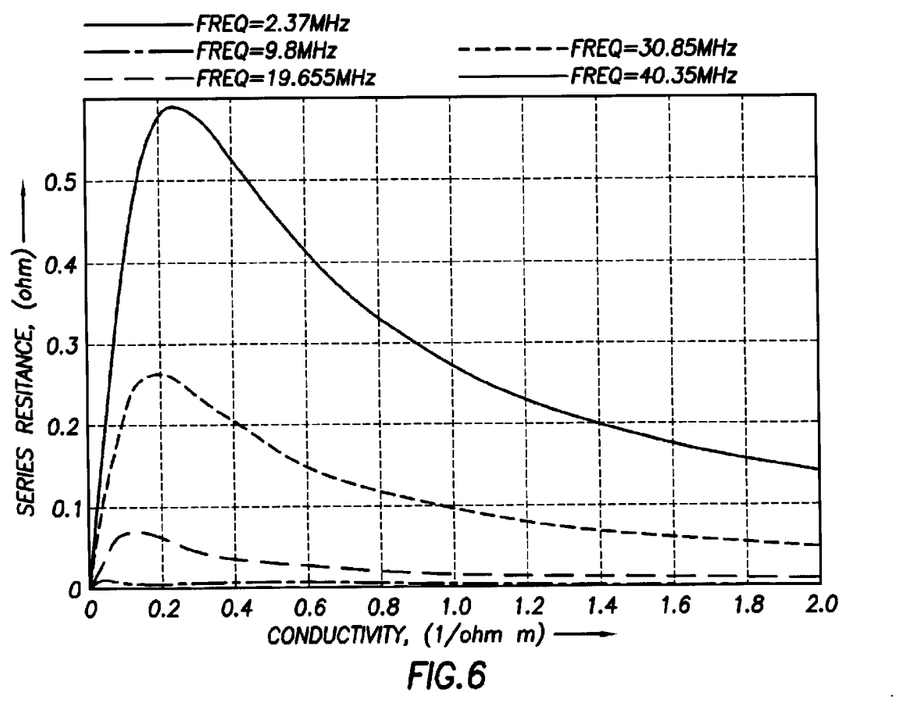
FIG. 6 is a graph of series resistance due to dielectric loss plotted as a function of sample conductivity at various frequencies.

The series resistance due to dielectric loss is calculated at different frequencies and it is plotted in FIG. 6. The conductivity at which the resistance goes thru a maximum is shifted towards lower and lower conductivity as the frequency is decreased. The tuning frequency will shift to lower frequencies because of the imaginary term in Equation (12).

The series resistance of the tuned antenna for a conductive sample is determined by all three loss mechanisms treated above. The quality factor of the tuned antenna is given as Q=ωL/(Rint+$R_L$+$R_D$) (16) where ω is the frequency, L is the inductor, Rint is the series resistance due to internal losses, $R_L$ is the series resistance due to inductive losses, and $R_D$ is the series resistance due to dielectric losses.

The dielectric loss at lower conductivities is more than the inductive loss (see FIGS. 5 and 6), whereas at higher conductivities the inductive losses dominate the dielectric loss. The dielectric and inductive loss are both less at lower frequencies than at higher frequencies.

Figure 17:
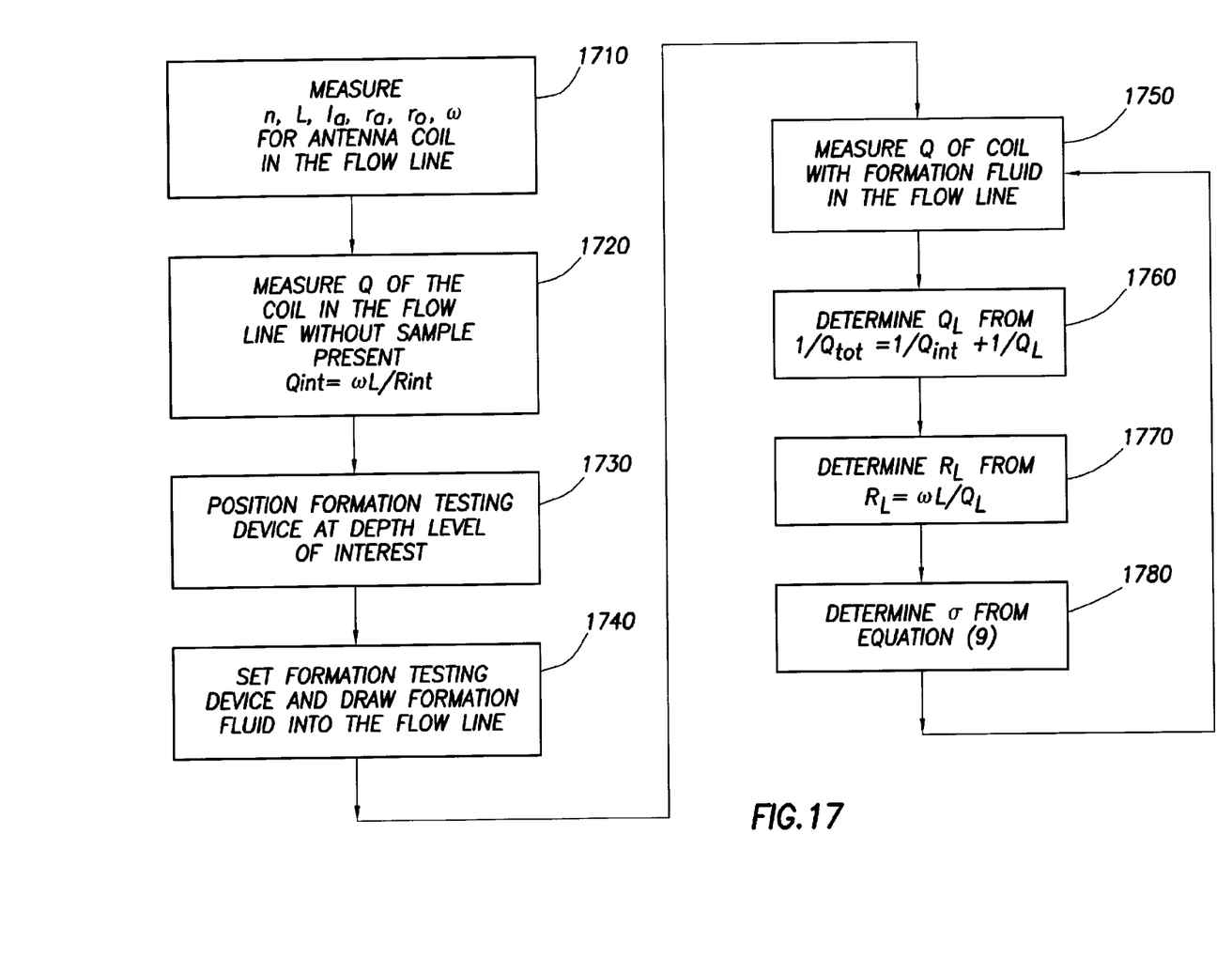
FIG. 17 is a flow diagram of the steps of a routine for practicing an embodiment of the invention.

Referring to FIG. 17, there is shown a flow diagram of a routine for controlling a processor or processors, uphole and/or downhole, in accordance with an embodiment of the invention. If desired, some of the steps may even be performed remote from the wellsite.

The block 1710 represents determining and/or measuring of n, L, $I_a$, $r_a$, and $r_o$ for the antenna coil 190 in the flowline. The Q of the antenna is measured (block 1720) without a sample in the flowline. (Alternatively, the reference Q of the antenna coil could be measured with a reference material in the flow line). The routine of FIGS. 19–20, to be described, can be utilized. The determinations and/or measurements represented by the blocks 1710 and 1720 can be performed, a priori, uphole. The block 1730 represents positioning the formation testing device 100 at a depth level of interest in the borehole, and the block 1740 represents setting of the device and drawing formation fluid into the flow line. As is known in the art, a pretest can be implemented before the fluid to be tested is drawn. The block 1750 represents measuring of the Q of the coil 190 with formation fluid in the flow line. Again, the routine of FIGS. 19, 20 can be utilized. Then, as represented by the blocks 1760 and 1770, $Q_L$ is determined from a difference in reciprocals, and $R_L$ is determined using relationship (1). Then, the fluid conductivity, $\sigma$, can be determined using equation (9).

Figure 18:
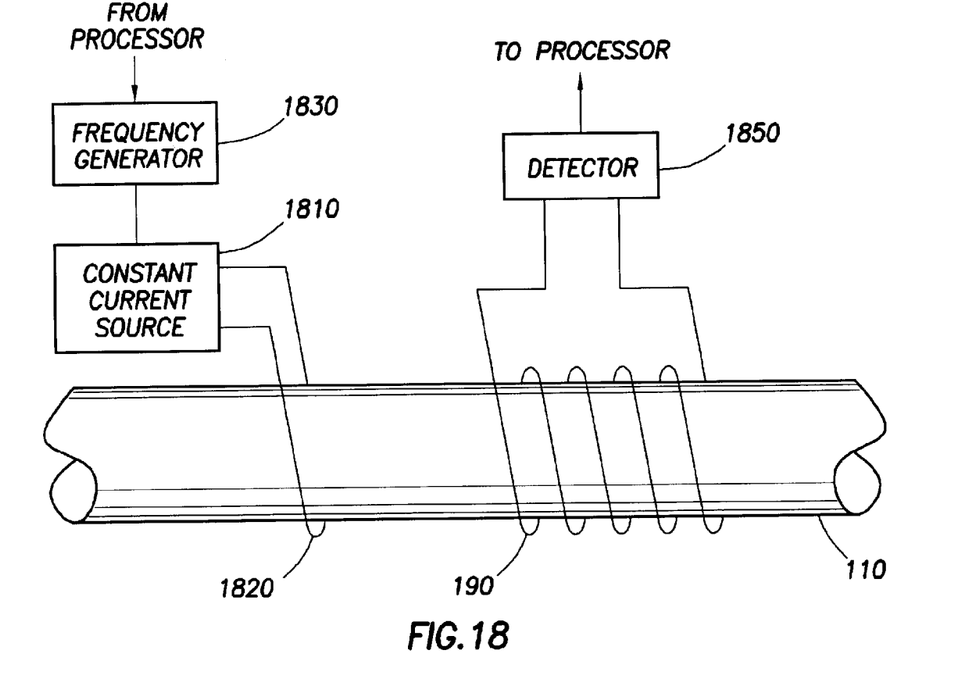
FIG. 18 is a diagram of equipment used in implementing an embodiment of the invention.
Figure 19:
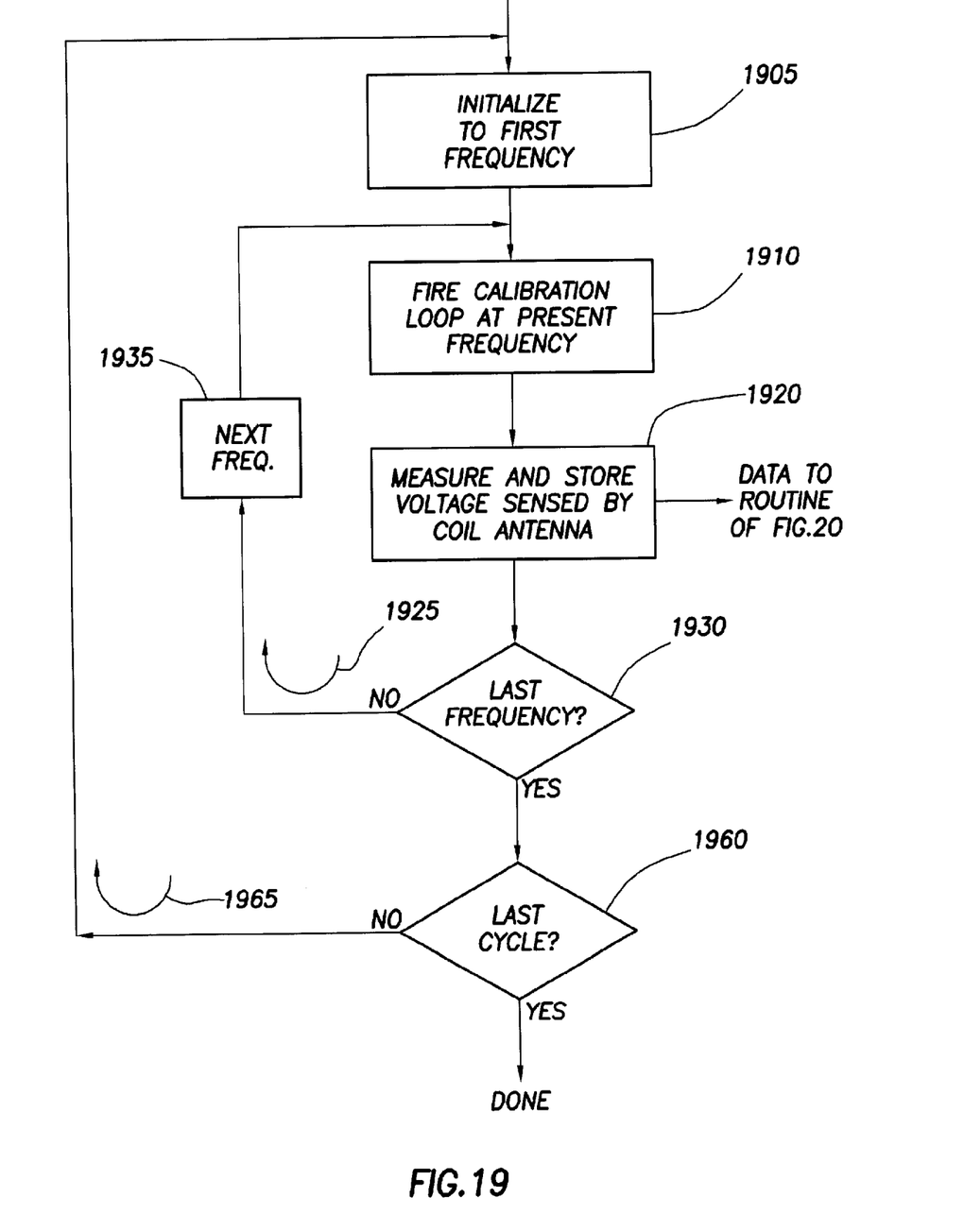
FIGS. 19 and 20 are flow diagram of routines in accordance with an embodiment of the invention.
Figure 20:
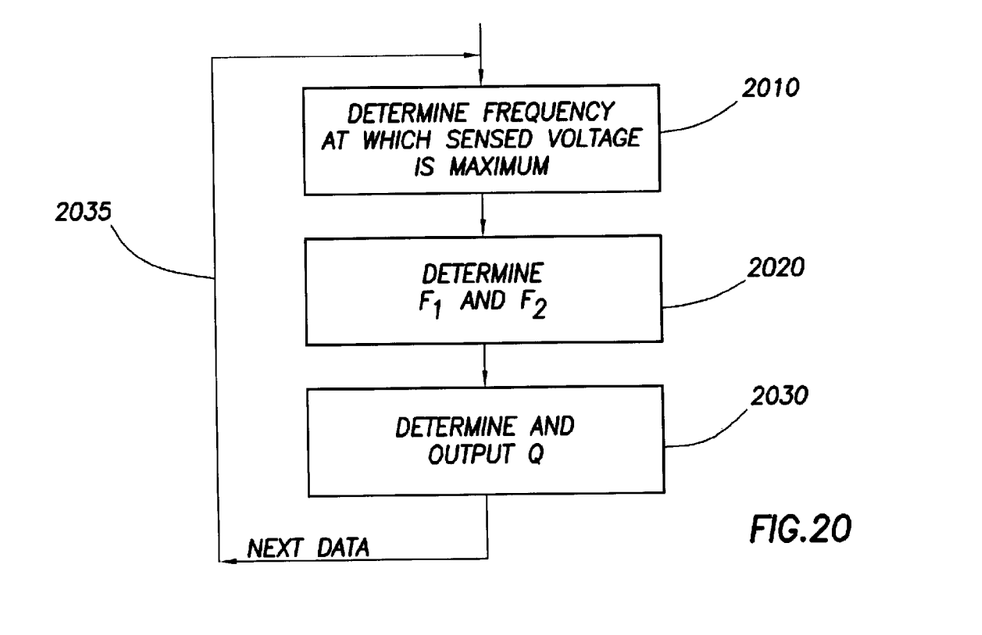

The quality factor, Q of the coil can be determined in any suitable manner, one embodiment being illustrated in conjunction with FIGS. 18 and 19. FIG. 18 shows the flow line 110 and coil 190, which, as noted above, can, if desired, serve dual purpose as an NMR flow line antenna. In the FIG. 18 embodiment, excitation is provided by constant current source 1810 and an antenna shown as calibration loop 1820. A frequency generator 1830, under control of the processor, provides input to the constant current source 1810. In operation, the loop 1820 is fired at a preselected for a predetermined time, for example a few milliseconds. The detector 1850 is used to measure the voltage sensed by the coil. The procedure is then repeated for the next pre-selected frequency. A flow diagram of the process is shown in FIG. 19. The block 1905 represents initialization to a first frequency, and the blocks 1910 and 1920 respectively represent firing of the loop 1820, and measurement and storage of the voltage sensed by the coil 190. The measurement data is processed in accordance with the routine of FIG. 20, to be treated momentarily. Determination is then made (decision block 1930) as to whether the last preselected frequency has been employed. If not, the frequency generator is set to the next preselected frequency (block 1935), and the loop 1925 continues until all of the preselected frequencies have been used. Inquiry is then made (decision block 1960) as to whether another cycle of data collection is to be performed and, if so, block 1905 is reentered, and the loop 1965 continues as further measurements are made and data collected.

Figure 21:
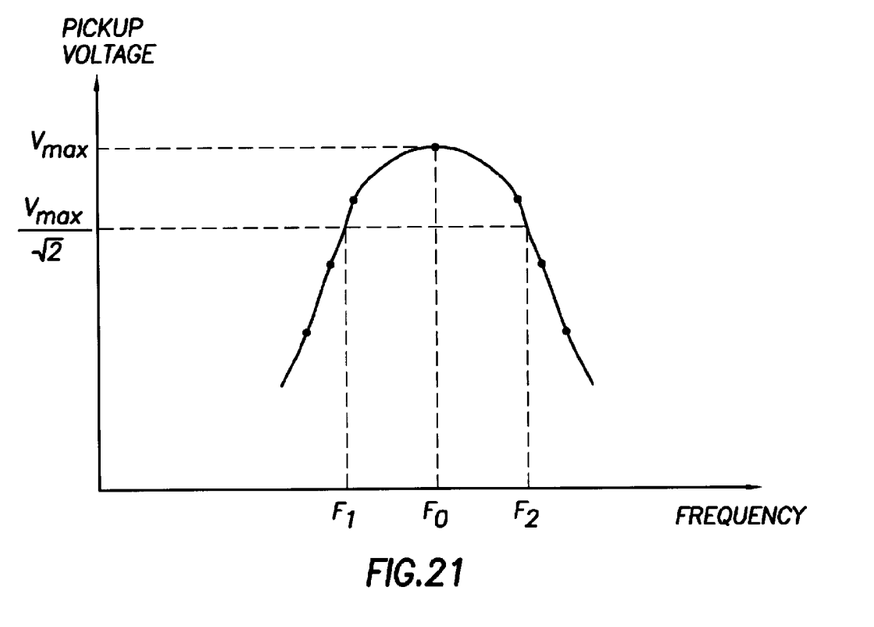
FIG. 21 is a graph useful in understanding operation of an embodiment of the invention.

In the graph of FIG. 21, the voltage induced in the antenna coil 190 is shown plotted as a function of frequency. The voltage maximum, $V_{max}$, is at a frequency $F_o$. The frequencies at which the detected voltages are $V_{max}/\sqrt{2}$ are designated $F_1$ and $F_2$. The quality factor, Q, is the ratio of $F_o$ to the bandwidth, $(F_2F_1)$; that is, $Q=F_o/(F_2F_1)$. In the flow diagram of FIG. 20, The block 2010 represents determination of the frequency $(F_o)$ at which the detected voltage is a maximum. Then, as represented by the block 2020, the frequencies at which detected voltages are $V_{max}/\sqrt{2}$ are determined, these being designated $F_1$ and $F_2$. Then, the quality factor, Q can be computed from $Q=F_o/(F_2F_1)$ as set forth in block 2030. A loop 2035 continues as further measurements are made and data collected.

As seen from step 1760 of the flow diagram of FIG. 17, the component $Q_D$ is not considered in this embodiment. The use of a Faraday shield, as in FIG. 16, will reduce or eliminate the $R_D$ component, strengthening the validity of this approximation. In a further embodiment hereof, in the absence of a Faraday shield, the dielectric constant of the formation fluid in the flow line is determined, as well as the conductivity of the fluid. By using a plurality of frequencies, thereby tuning the antenna at different frequencies by changing the effect of the capacitance in parallel with the inductor in the circuit model, both dielectric constant and conductivity can be determined. In an example of this embodiment, Q is measured at two frequencies. Then, the two unknowns of equations (9) and (15), namely conductivity, $\sigma$, and dielectric constant, K, are determined, such as by simultaneous solution of these equations.

In a further embodiment hereof, the pickup voltage sensed at the coil 190 upon excitation with the calibration loop can be utilized to obtain the formation fluid resistivity, since the pickup voltage is proportional to Q.

Experimental results will next be described. A solenoid coil was wrapped around a test tube with an id of 0.197" and the coil has 8 turns, the diameter of the coil was 0.2", and the length of the coil was 0.5". HP Impedance/Gain-Phase Analyzer was used to measure the quality factor of the antenna and the series resistance was determined from the equivalent circuit of the data. The conductivity was measured using a conductivity meter, WTW, model # LF 330.

The coil was tuned to a particular frequency using a capacitor in parallel with the coil. The conductivity of the water sample was varied with varying sodium chloride concentration. The Q of the tuned circuit was measured as a function of the conductivity of the water sample. The Q measurement was repeated at various frequencies as a function of salt concentration in water.

The theoretical series resistance calculated using equations (9) and (15) was compared with the experimental data, and substantial agreement between the theory and the experimental data was observed.

Figure 7:
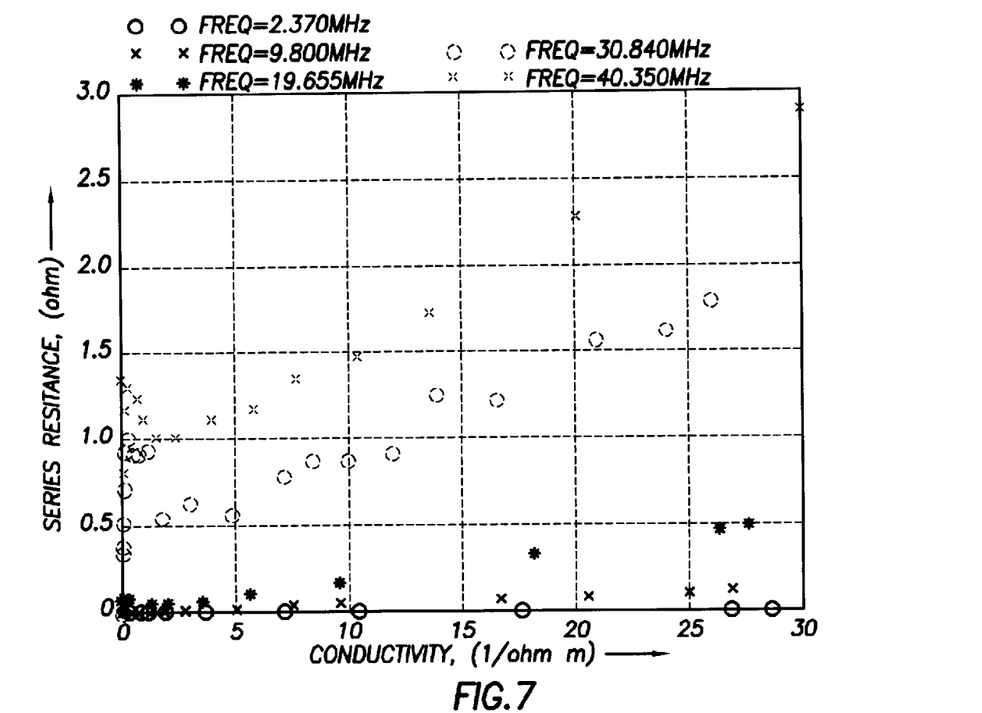
FIG. 7 shows experimental data of series resistance as a function of conductivity at various frequencies.
Figure 8:
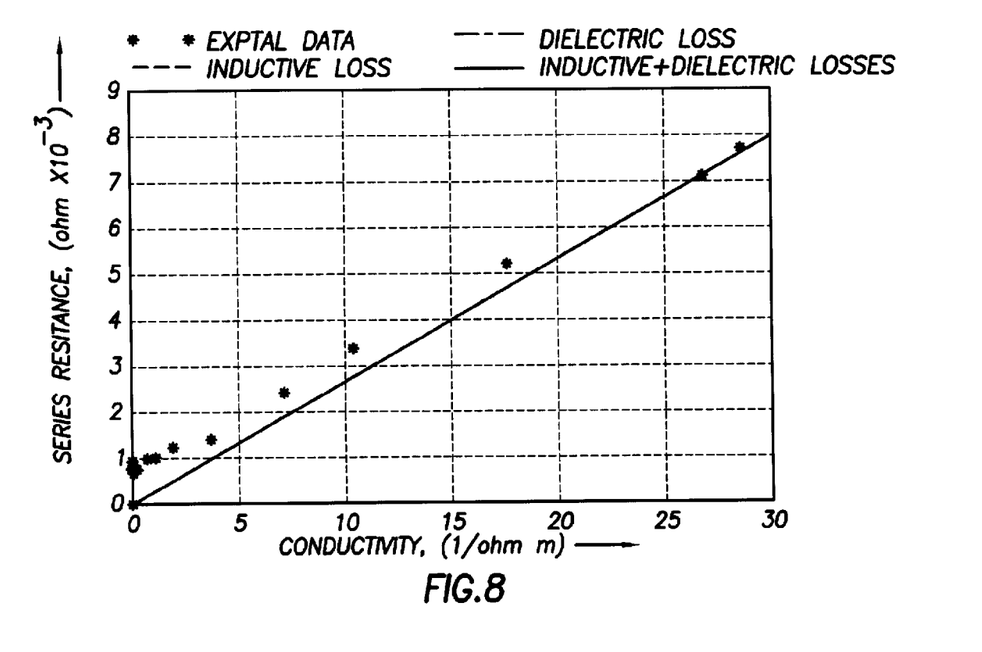
FIG. 8 is a graph showing calculated and experimental series resistance as a function of sample conductivity at 2.37 MHz.
Figure 9:
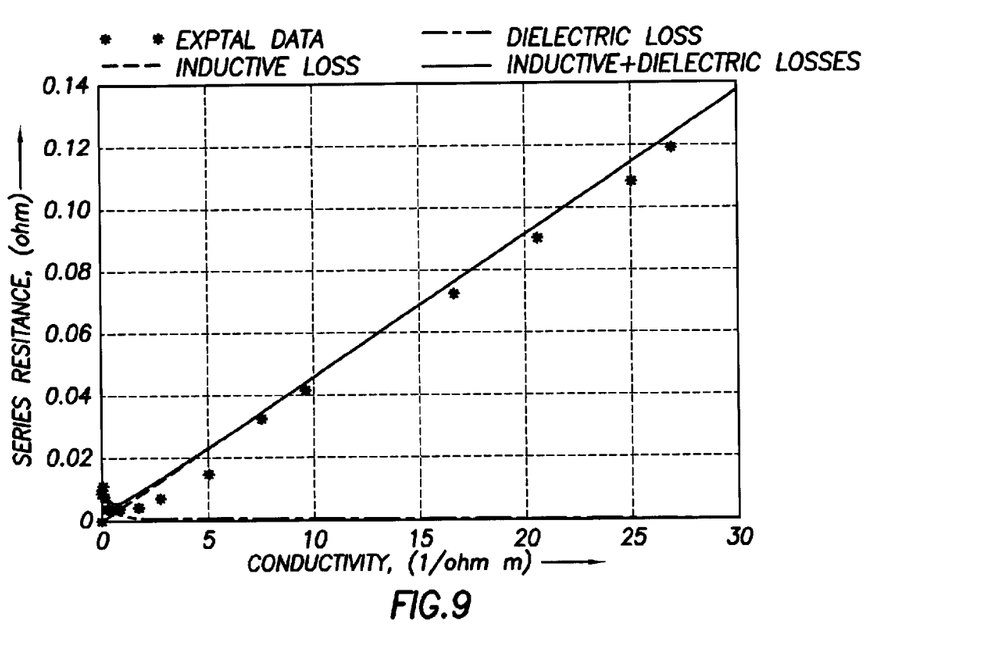
Figure 10:
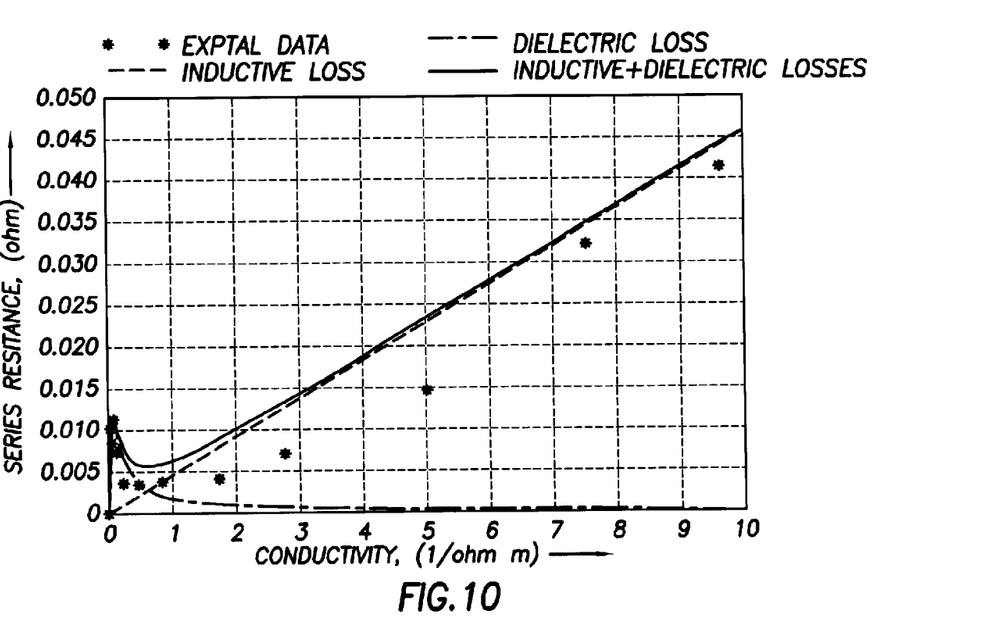
Figure 11:
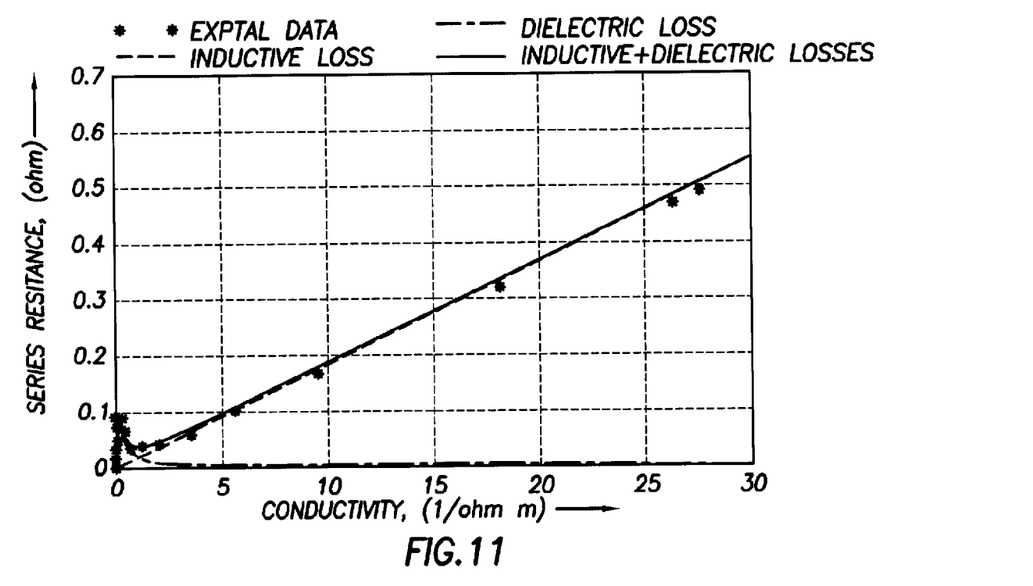
Figure 12:
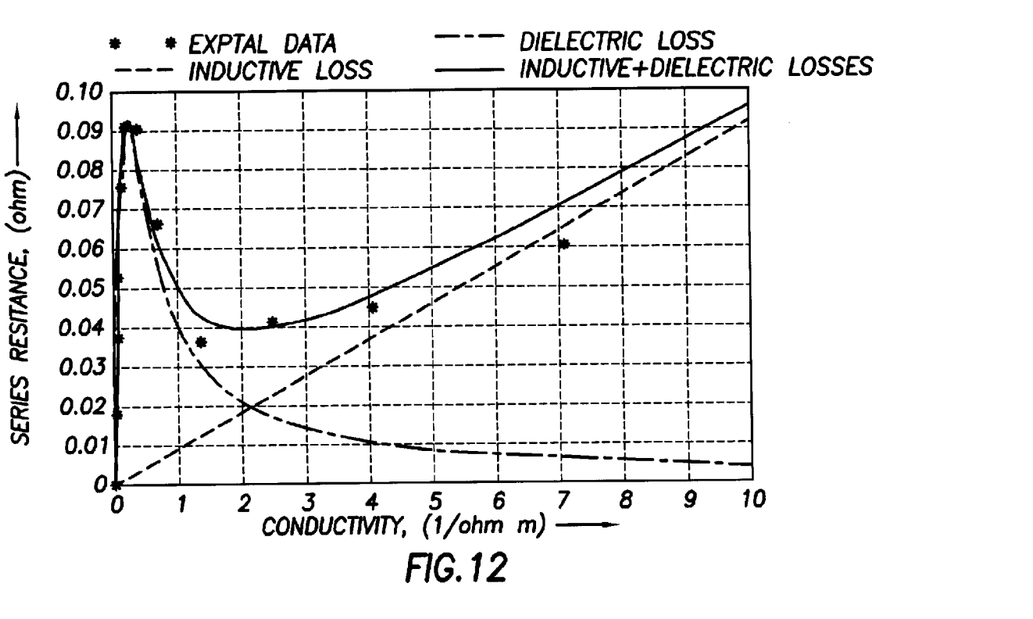
Figure 13:
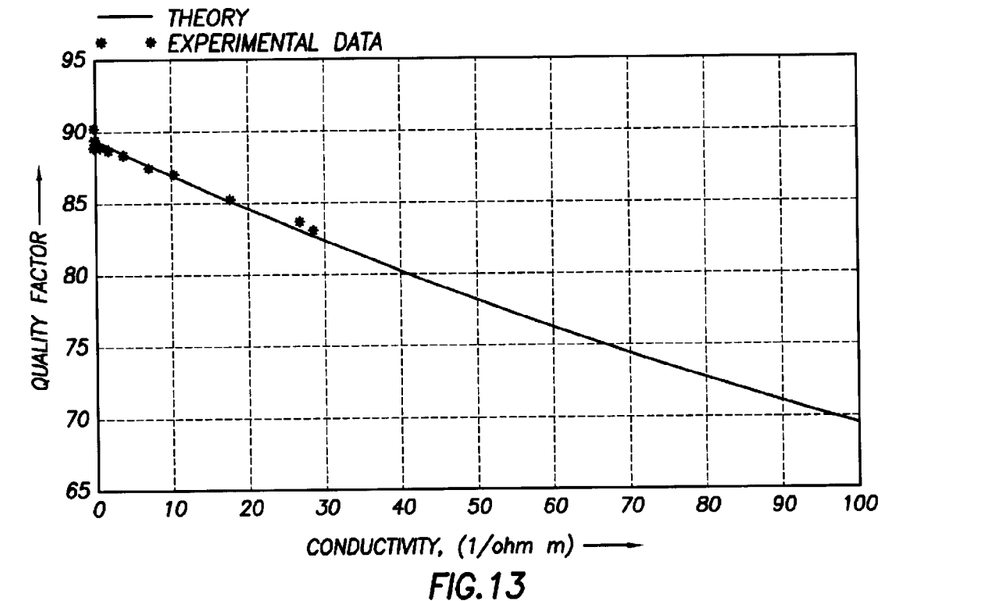
FIG. 13 is a graph showing theoretical and experimental data of quality factor, Q, at 2.37 MHz.
Figure 14:
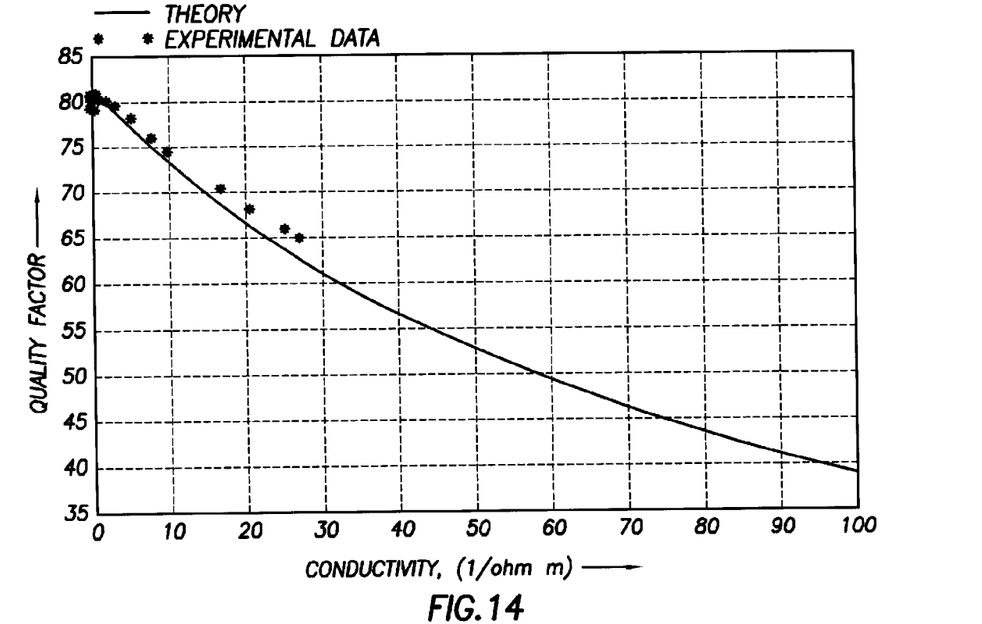
FIG. 14 is a graph showing theoretical and experimental data of quality factor, Q, at 9.8 MHz.
Figure 15:
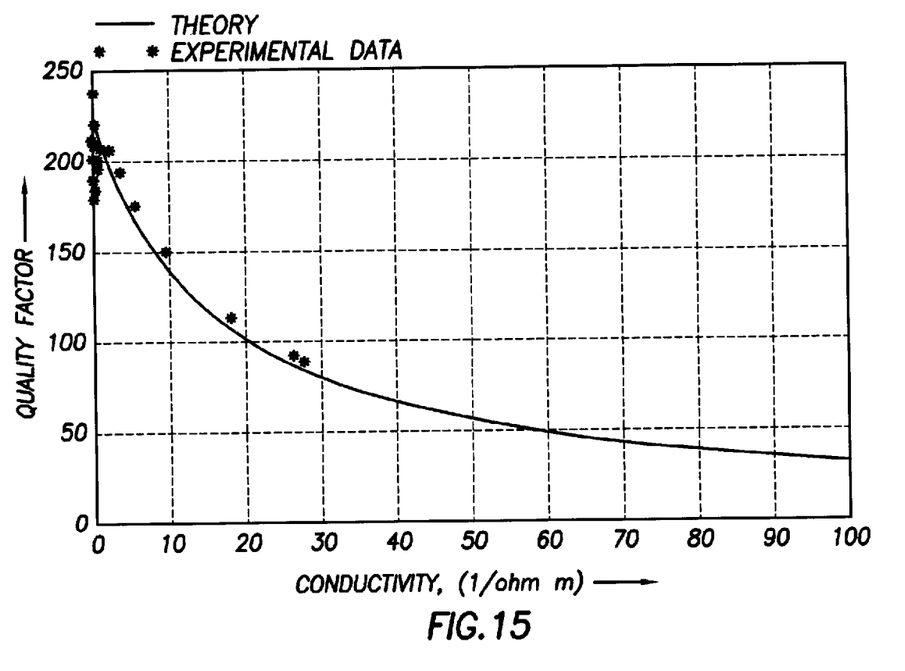
FIG. 15 is a graph showing theoretical and experimental data of quality factor, Q, at 19.655 MHz.
Figure 22:
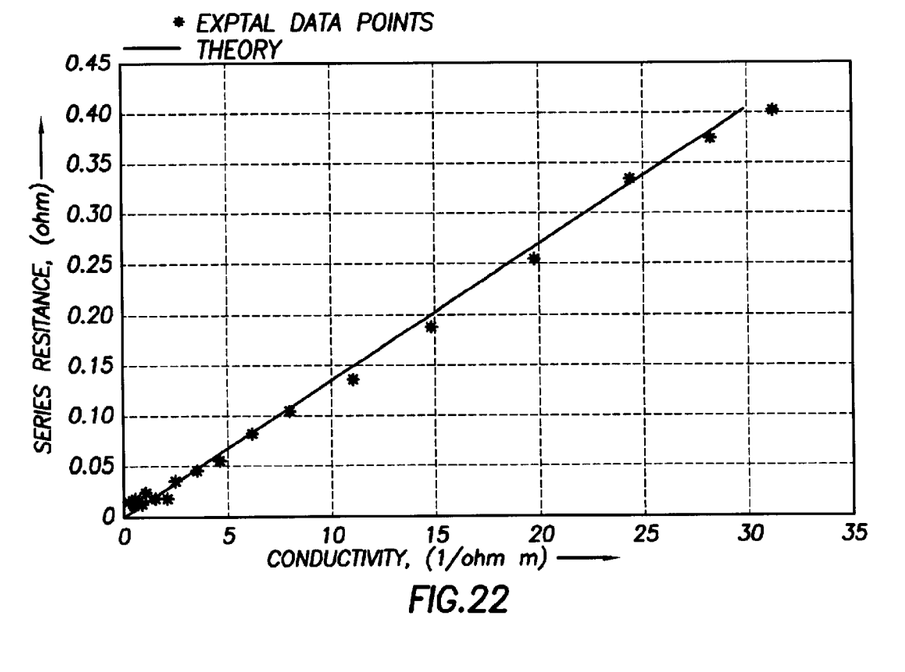
FIG. 22 is a graph showing theoretical and experimental data of series resistance as a function of sample conductivity at 18.225 MHz, with use of a Faraday shield.

FIG. 7 shows experimental data of series resistance as a function of conductivity at various frequencies. FIG. 8 is a graph showing calculated and experimental series resistance as a function of sample conductivity at 2.37 MHz. At this operating frequency, dielectric loss is negligible, even without a Faraday shield. FIGS. 9 and 10 are graphs showing calculated and experimental series resistance as a function of sample conductivity at 9.88 MHz. In FIG. 10, lower conductivities are shown in further detail. FIGS. 11 and 12 are graphs showing calculated and experimental series resistance as a function of sample conductivity at 19.655 MHz. FIG. 12 shows lower conductivities in further detail. FIG. 13 is a graph showing theoretical and experimental data of quality factor, Q, at 2.37 MHz. FIG. 14 is a graph showing theoretical and experimental data of quality factor, Q, at 9.8 MHz. FIG. 15 is a graph showing theoretical and experimental data of quality factor, Q, at 19.655 MHz. FIG. 22 is a graph showing theoretical and experimental data of series resistance as a function of sample conductivity at 18.225 MHz, with use of a Faraday shield.

While the invention has been described using a limited number of embodiments, those skilled in the art, having the benefit of this disclosure, will appreciate that other variations are possible without departing from the scope of the invention as disclosed herein. Accordingly, the scope of the invention should be limited only by the attached claims.

What is claimed is:

1. A method for determining the resistivity of fluids from formations surrounding an earth borehole, comprising the steps of:

providing a coil;

determining a reference quality factor of the coil;

disposing the coil in the borehole, and causing formation fluid to flow axially through the coil;

measuring the quality factor of the coil with formation fluid within; and determining the resistivity of the formation fluid within the coil as a function of said measured quality factor and said reference quality factor.

2. The method as defined by claim 1, wherein said step of measuring the quality factor is performed as formation fluid flows axially through the coil.

3. The method as defined by claim 1, wherein said step of measuring the quality factor is performed with said formation fluid axially within the coil and non-flowing.

4. The method as defined by claim 1, further comprising providing a Faraday shield between said coil and said fluid.

5. The method as defined by claim 1, wherein said step of determining a reference quality factor of said coil comprises measuring the quality factor of said coil with an empty flow line axially therein.

6. The method as defined by claim 1, wherein said step of causing fluid to flow axially through the coil comprises causing said fluid to flow through a flow line, a portion of which passes axially through said coil.

7. The method as defined by claim 6, further comprising providing a Faraday shield between said coil and said flow line.

8. The method as defined by claim 6, further comprising providing a Faraday shield between said coil and said flow line, said shield being operative to prevent electrical lines of force associated with distributed capacitance from passing through said formation fluid within said coil during said step of measuring the quality factor of said coil.

9. The method as defined by claim 6, wherein said step of determining a reference quality factor of said coil comprises measuring the quality factor of said coil with a reference fluid in said flow line.

10. The method as defined by claim 1, wherein said step of measuring the quality factor of said coil includes measuring signals sensed at said coil upon electrical excitation of said coil.

11. The method as defined by claim 10, wherein excitation of said coil is implemented by exciting a loop on said flow line.

12. The method as defined by claim 1, wherein said step of determining the resistivity of the formation fluid within said coil further comprises determining the dielectric constant of said formation fluid within the coil.

13. The method as defined by claim 12, wherein said step of determining the quality factor of the coil with formation fluid therein includes measuring signals sensed at said coil upon electrical excitation at a plurality of frequencies.

14. The method as defined by claim 13, wherein excitation of said coil is implemented by exciting a loop on said flow line.

15. The method as defined by claim 1, wherein said step of determining the quality factor of the coil with formation fluid therein includes measuring signals sensed at said coil upon electrical excitation at a plurality of frequencies.

16. The method as defined by claim 15, wherein excitation of said coil is implemented by exciting a loop on said flow line.

17. A method for determining the dielectric constant of fluids from formations surrounding an earth borehole, comprising the steps of:

providing a coil;

determining a reference quality factor of the coil;

disposing the coil in the borehole, and causing formation fluid to flow axially through the coil;

measuring the quality factor of the coil with formation fluid within; and determining the dielectric constant of the formation fluid within the coil as a function of said measured quality factor and said reference quality factor.

18. The method as defined by claim 17, wherein said step of determining the quality factor of the coil with formation fluid therein includes measuring signals sensed at said coil upon electrical excitation at a plurality of frequencies.

19. A method for determining the resistivity of fluids from formations surrounding an earth borehole, comprising the steps of:

providing a formation testing logging device that includes a coil and a flow line passing axially through said coil;

determining a reference quality factor of the coil;

positioning the formation testing device in the borehole, and causing formation fluid to flow through the flow line;

measuring the quality factor of the coil with formation fluid in the flow line; and determining the resistivity of the formation fluid in the flow line as a function of said measured quality factor and said reference quality factor.

20. The method as defined by claim 19, wherein said step of measuring the quality factor is performed as formation fluid flows axially through the coil.

21. The method as defined by claim 19, wherein said step of measuring the quality factor is performed with said formation fluid axially within the coil and non-flowing.

22. The method as defined by claim 19, further comprising providing a Faraday shield between said coil and said flow line.

23. The method as defined by claim 19, further comprising providing a Faraday shield between said coil and said flow line, said shield being operative to prevent electrical lines of force associated with distributed capacitance from passing through said formation fluid within said coil during said step of measuring the quality factor of said coil.

24. The method as defined by claim 19, wherein said step of determining a reference quality factor of said coil comprises measuring the quality factor of said coil with said flow line empty.

25. The method as defined by claim 19, wherein said step of determining a reference quality factor of said coil comprises measuring the quality factor of said coil with a reference fluid in said flow line.

26. The method as defined by claim 19, wherein said step of determining the resistivity of the formation fluid within said coil further comprises determining the dielectric constant of said formation fluid within the coil.

27. The method as defined by claim 19, wherein said step of determining the quality factor of the coil with formation fluid therein includes measuring signals sensed at said coil upon electrical excitation at a plurality of frequencies.

28. The method as defined by claim 19, wherein said step of measuring the quality factor of said coil includes measuring signals sensed at said coil upon electrical excitation of said coil.

29. The method as defined by claim 28, wherein excitation of said coil is implemented by exciting a loop on said flow line.

* * * * *